United States Patent
Yoon (10) Patent No.: US 11,187,757 B2
(45) Date of Patent: Nov. 30, 2021

(54) DEVICE AND METHOD FOR ANALYZING SOH

(71) Applicant: LG CHEM, LTD., Seoul (KR)

(72) Inventor: Hyo-Jung Yoon, Daejeon (KR)

(73) Assignee: LG Chem, Ltd., Seoul (KR)

( * ) Notice: Subject to any disclaimer, the term of this patent is extended or adjusted under 35 U.S.C. 154(b) by 101 days.

(21) Appl. No.: 16/625,361

(22) PCT Filed: Jan. 4, 2019

(86) PCT No.: PCT/KR2019/000170
§ 371 (c)(1),
(2) Date: Dec. 20, 2019

(87) PCT Pub. No.: WO2019/146928
PCT Pub. Date: Aug. 1, 2019

(65) Prior Publication Data
US 2021/0148985 A1     May 20, 2021

(30) Foreign Application Priority Data
Jan. 26, 2018  (KR) .................. 10-2018-0009875

(51) Int. Cl.
*G01R 31/392*     (2019.01)
*G01R 31/3835*    (2019.01)
(Continued)

(52) U.S. Cl.
CPC ............. *G01R 31/392* (2019.01); *G01K 7/02* (2013.01); *G01R 31/367* (2019.01); *G01R 31/3835* (2019.01)

(58) Field of Classification Search
None
See application file for complete search history.

(56) References Cited

U.S. PATENT DOCUMENTS

| 8,036,839 B2 | 10/2011 | Machiyama et al. |
| 2002/0109506 A1 | 8/2002 | Kawakami et al. |

(Continued)

FOREIGN PATENT DOCUMENTS

| CN | 103402809 A | 11/2013 |
| CN | 104424396 A | 3/2015 |

(Continued)

OTHER PUBLICATIONS

Extended European Search Report issued in corresponding European Patent Application No. 19744525.7, dated Nov. 18, 2020.
(Continued)

*Primary Examiner* — Jas A Sanghera
(74) *Attorney, Agent, or Firm* — Morgan, Lewis & Bockius LLP (57) ABSTRACT

Disclosed is an apparatus and method capable of analyzing a state of health (SOH) of a battery, and an apparatus and method capable of diagnosing whether or not to reuse the battery, wherein the battery SOH analyzing apparatus includes a memory unit configured to store reference temperature data according to depth of discharge (DOD) of a reference battery, or a reference temperature increase rate (K1) of a discharge last half with DOD of 50% or above, calculated therefrom; and a control unit.

10 Claims, 3 Drawing Sheets

(51) Int. Cl.
  *G01R 31/367* (2019.01)
  *G01K 7/02* (2021.01)

(56) References Cited

U.S. PATENT DOCUMENTS

| | | |
|---|---|---|
| 2006/0177734 A1 | 8/2006 | Yao |
| 2007/0036197 A1* | 2/2007 | Huttenlocher ........... G01K 7/42 374/1 |
| 2012/0265462 A1 | 10/2012 | Iwane et al. |
| 2013/0038333 A1 | 2/2013 | Harada |
| 2013/0096858 A1 | 4/2013 | Amano et al. |
| 2013/0322488 A1 | 12/2013 | Yazami et al. |
| 2014/0095092 A1 | 4/2014 | Ikeda et al. |
| 2014/0214349 A1 | 7/2014 | Dong et al. |
| 2015/0066407 A1 | 3/2015 | Joe et al. |
| 2015/0066837 A1 | 3/2015 | Twarog et al. |
| 2015/0316636 A1 | 11/2015 | Nishijima et al. |
| 2016/0055736 A1 | 2/2016 | Xie et al. |

FOREIGN PATENT DOCUMENTS

| | | |
|---|---|---|
| CN | 106926839 A | 7/2017 |
| EP | 3273523 A1 | 1/2018 |
| JP | H10-341505 A | 12/1998 |
| JP | 2008-039526 A | 2/2008 |
| JP | WO2009/118910 A1 | 10/2009 |
| JP | 5024455 B2 | 6/2012 |
| JP | 2013-089424 A | 5/2013 |
| JP | 2014-070982 A | 4/2014 |
| JP | 5515524 B2 | 6/2014 |
| JP | 2016-081638 A | 5/2016 |
| JP | 2016-513241 A | 5/2016 |
| JP | 6165620 B2 | 7/2017 |
| KR | 10-2001-0107687 A | 12/2001 |
| KR | 10-2006-0089597 A | 8/2006 |
| KR | 10-2013-0122543 A | 11/2013 |
| KR | 10-2016-0011449 A | 2/2016 |
| KR | 10-2017-0112490 A | 10/2017 |

OTHER PUBLICATIONS

Massimo et al., "Automated Generation of Battery Aging Models from Datasheets," 2014 IEEE 32nd International conference on computer design (ICCD), IEEE, pp. 483-488 (2014), XP032695574.
International Search Report issued in corresponding International Patent Application No. PCT/KR2019/000170, dated Apr. 18, 2019.

* cited by examiner

DEVICE AND METHOD FOR ANALYZING SOH

TECHNICAL FIELD

The present disclosure relates to an apparatus and method for analyzing a state of health (SOH) of a battery. More particularly, the present disclosure relates to an apparatus and method for determining the degree of degradation by measuring a temperature of a battery. The present application claims priority to Korean Patent Application No. 10-2018-0009875 filed on Jan. 26, 2018 in the Republic of Korea, the disclosures of which are incorporated herein by reference.

BACKGROUND ART

Batteries can be recharged repeatedly, and they are gaining attention as an alternative to fuel energy. They have been primarily used in traditional handheld devices such as mobile phones, video cameras and electric power tools. Recently, the range of applications tends to gradually extend to electric vehicles (EVs, HEVs, PHEVs), large-capacity energy storage systems (ESSs) and uninterruptible power systems (UPSs).

A battery includes a positive electrode, a negative electrode, a separator interposed between the electrodes, and an electrolyte that electrochemically reacts with an active material coated on the positive electrode and the negative electrode, and as the number of charge/discharge cycles increases, capacity reduces. The capacity reduction may be caused by the degradation of the active material coated on the electrode, the side reaction of the electrolyte, the pore reduction of the separator, etc.

When battery capacity reduces, resistance increases and electrical energy that is lost as heat increases. Accordingly, when battery capacity reduces below the threshold, the battery performance notably reduces and an amount of heat generated increases, so it is necessary to investigate or replace the battery.

In the field of battery technology, an extent to which battery capacity reduces may be quantitatively indicated by a factor such as a State Of Health (SOH). SOH can be analyzed by many methods, and one of those methods calculates SOH by quantifying an extent at which battery resistance at the current time increased compared to resistance at Beginning Of Life (BOL). For example, when battery resistance has increased by 20% compared to resistance at BOL, SOH may be estimated to be 80%. Alternatively, SOC can also be analyzed based on current and voltage of a battery.

It is possible to extend the battery life by controlling the maximum allowable current based on SOH. To this end, it is necessary to accurately analyze the SOH of the battery.

Meanwhile, as the battery is expanded to ESS, EV, HEV, PHEV, etc., researches are being actively carried out to reuse the battery by switching the use of the battery.

In particular, in recent years, in order to reduce cost, an attempt is made to convert the battery used for an electric vehicle to a battery for ESS driven in a milder condition.

However, as several hundreds of charge/discharge cycles are performed, a sudden death happens frequently at the battery due to gas generation by side reactions, Li plating, electrolyte decomposition, electrolyte depletion or the like. Thus, in order to reuse existing batteries, it is important to properly classify a battery capable of being reused by accurately analyzing the SOH at the time of reuse.

DISCLOSURE

Technical Problem

The present disclosure is directed to providing an apparatus and method, which may analyze SOH of a battery.

The present disclosure is further directed to providing an apparatus and method, which may diagnose whether the battery is reusable by analyzing SOH of the battery.

Technical Solution

In one aspect of the present disclosure, there is provided a state of health (SOH) analyzing apparatus, comprising: a memory unit configured to store reference temperature data according to depth of discharge (DOD) of a reference battery, or a reference temperature increase rate K1 of a discharge last half with DOD of 50% or above, calculated therefrom; and a control unit. The control unit includes: a measuring and recording unit configured to measure temperature data according to DOD while a battery in a full charge state is being discharged and store the measured temperature data in the memory unit; a calculating unit configured to calculate a temperature increase rate K2 of the discharge last half with DOD of 50% or above from the temperature data according to DOD obtained by the measuring and recording unit; and a determining unit configured to determine a degree of degradation of the battery in comparison to the reference battery by comparing the reference temperature increase rate K1 and the temperature increase rate K2.

Preferably, the SOH analyzing apparatus according to the present disclosure may further include a voltage measuring unit for measuring the voltage of the battery; a current measuring unit for measuring the current of the battery; and a temperature measuring unit for measuring the temperature of the battery, and the control unit may be configured to store the measured voltage, the measured current and the measured temperature in the memory unit.

In the SOH analyzing apparatus according to the present disclosure, the control unit may be configured to determine the output of the battery by judging the degree of degradation, or to transmit the degree of degradation to an external device.

In another aspect of the present disclosure, there is provided a SOH analyzing method, comprising: (a) obtaining reference temperature data according to DOD by measuring a temperature of a reference battery according to DOD while the reference battery in a full charge state is being discharged; (b) calculating a reference temperature increase rate K1 of a discharge last half with DOD of 50% or above from the reference temperature data according to DOD; (c) obtaining temperature data according to DOD by measuring a battery temperature according to DOD while a battery in a full charge state is being discharged; (d) calculating a temperature increase rate K2 of the discharge last half with DOD of 50% or above from the temperature data according to DOD; and (e) determining a degree of degradation of the battery in comparison to the reference battery by comparing the reference temperature increase rate K1 and the temperature increase rate K2.

In the SOH analyzing method according to the present disclosure, the discharge in the steps (a) and (c) may be a constant current (CC) discharge, and the temperature may be a battery surface temperature.

In the steps (b) and (d), the temperature increase rate may be calculated by: preparing a temperature profile by plotting temperature data according to DOD; and obtaining a graph tangent slope of a DOD last half after finding an onset second inflection point in the temperature profile.

In the SOH analyzing method according to the present disclosure, as the temperature increase rate K2 is greater, the battery may be determined as having a greater degree of degradation.

In another aspect of the present disclosure, there is provided a battery management system, comprising the SOH analyzing apparatus, and there is also provided a computer-readable recording medium on which the SOH analyzing method is programmed and recorded.

In another aspect of the present disclosure, there is provided a battery reuse diagnosing apparatus, comprising: the SOH analyzing apparatus according to the present disclosure; a battery holder; and a display device configured to display a calculation result or a determination result of the SOH analyzing apparatus.

In another aspect of the present disclosure, there is provided a battery reuse diagnosing method, comprising: (a) obtaining a reference temperature profile according to DOD by measuring a surface temperature of a reference battery according to DOD while the reference battery in a full charge state is being discharged at a constant current; (b) calculating a slope S1 in the reference temperature profile; (c) obtaining a temperature profile of a battery subjected to reuse diagnosis according to DOD by measuring a surface temperature of the battery subjected to reuse diagnosis according to DOD while the battery subjected to reuse diagnosis in a full charge state is being discharged at a constant current; (d) calculating a slope S2' in the temperature profile of the battery subjected to reuse diagnosis according to DOD; and (e) determining whether or not to reuse the battery by determining a degree of degradation of the battery in comparison to the reference battery by comparing the slope S1 and the slope S2'.

Preferably, between the step (b) and the step (c), the battery reuse diagnosing method may further comprise: (b-1) obtaining a sample temperature profile according to DOD by acquiring a surface temperature of a sample battery according to DOD while the sample battery in a full charge state is being discharged at a constant current; (b-2) calculating a slope S2 in the sample temperature profile according to DOD; (b-3) determining that the sample battery is degraded in comparison to the reference battery when the slope S2 is greater than the slope S1, and recording correlation data between the degree of degradation and the slope S2; and (b-4) repeating the steps (b-1) to (b-3) to other sample batteries to accumulate correlation data between the degree of degradation and the slope S2, wherein in the step (e), it may be determined whether or not to reuse the battery by diagnosing the degree of degradation of the battery subjected to reuse diagnosis by finding the degree of degradation corresponding to the slope S2' from the correlation data between the degree of degradation and the slope S2.

Advantageous Effects

According to the present disclosure, it is possible to analyze SOH of a battery in a relatively simple way by monitoring a battery temperature change according to a depth of discharge (DOD).

According to the present disclosure, it is possible to properly classify whether the use of a battery subject to diagnosis can be converted or the battery should be discarded by accurately analyzing the SOH at the time of reuse of an existing battery.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawings.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

In the embodiment described below, a battery refers to a lithium battery. Here, the lithium battery refers collectively to batteries in which lithium ions act as working ions during charging and discharging, causing electrochemical reactions at the positive electrode and the negative electrode.

Meanwhile, it should be interpreted as that even though the name of the battery changes depending on the type of electrolyte or separator used in the lithium battery, the type of packaging used to package the battery and the internal or external structure of the lithium battery, the lithium battery covers any battery using lithium ions as working ions.

The present disclosure may be also applied to batteries other than lithium batteries. Accordingly, it should be interpreted as that the present disclosure covers any type of battery to which the technical aspects of the present disclosure may be applied, though working ions are not lithium ions.

Additionally, the battery is not limited to the number of components. Accordingly, the battery should be interpreted as including a unit cell including an assembly of positive electrode/separator/negative electrode and an electrolyte in a packaging material as well as an assembly of unit cells, a module including assemblies connected in series and/or in parallel, a pack including modules connected in series and/or in parallel, and a battery system including packs connected in series and/or in parallel.

Figure 1:
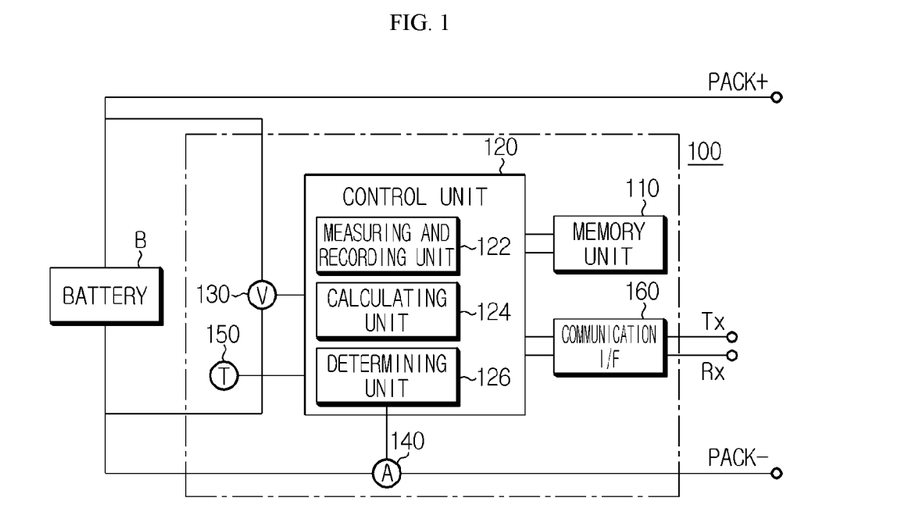
FIG. 1 is a block diagram schematically showing the configuration of a SOH analyzing apparatus according to an embodiment of the present disclosure.
Figure 2:
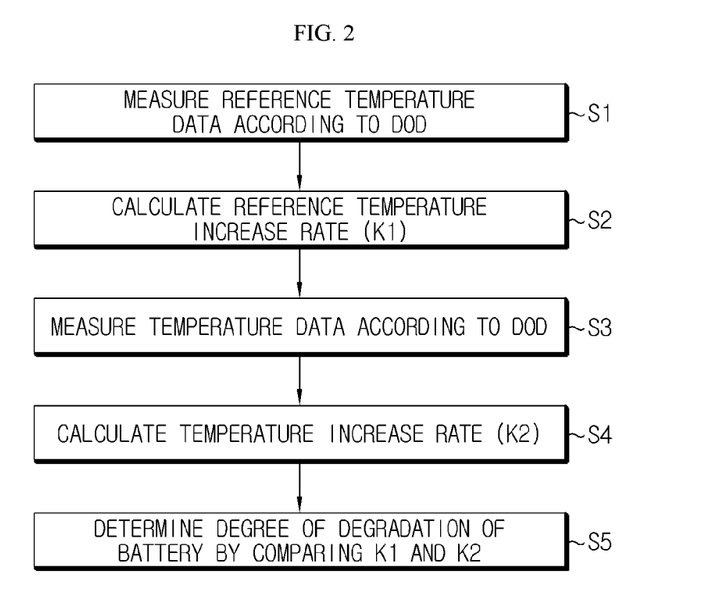
FIG. 2 is a flowchart for illustrating a SOH analyzing method according to an embodiment of the present disclosure.

FIG. 1 is a block diagram schematically showing the configuration of a SOH analyzing apparatus according to an embodiment of the present disclosure, and FIG. 2 is a flowchart for illustrating a SOH analyzing method according to an embodiment of the present disclosure.

A SOH analyzing apparatus and method will be described in detail with reference to FIGS. 1 and 2.

Referring to FIG. 1, the SOH analyzing apparatus 100 according to the present disclosure is an apparatus for analyzing SOH of a battery B, and includes at least a memory unit 110 and a control unit 120.

The control unit 120 includes a processor to perform logical computation, and functions to analyze SOH of the battery B according to control logic described below.

The memory unit 110 is a storing medium capable of recording or erasing data electrically, magnetically, optically or quantum-mechanically, and as a non-limiting example, may be RAM, ROM or register.

Preferably, the memory unit 110 may be connected to the control unit 120, for example, through a data bus, to allow the control unit 120 to access it.

The memory unit 110 may store and/or update and/or erase programs including various types of control logics executed by the control unit 120, predefined parameters and/or data created when the control logics are executed.

The memory unit 110 may be logically split into two or more, and may be included in the control unit 120, but is not limited thereto.

Preferably, the memory unit 110 stores reference temperature data according to depth of discharge (DOD) of a reference battery, or a reference temperature increase rate K1 of a discharge last half with DOD of 50% or above calculated therefrom, in advance.

The reference temperature data or the reference temperature increase rate K1 may be obtained by preliminary measurement through a discharge experiment for a reference battery, for example a battery in a beginning-of-life (BOL) state (corresponding to Step s1 in FIG. 2 as the first stage of the SOH analyzing method). The reference temperature data according to DOD may be obtained by measuring a temperature of the reference battery according to DOD while the reference battery in a full charge state is being discharged. At this time, the discharge is preferably a constant current (CC) discharge, and the temperature is preferably obtained by measuring a surface temperature of the reference battery.

DOD is 0% in a full charge state, and DOD is 100% in a full discharge state. As DOD increases as the discharge progresses, namely as DOD increases from 0% to 100%, the temperature of the reference battery gradually rises, thereby obtaining a temperature profile that generally increases along with the increase of DOD.

Figure 3:
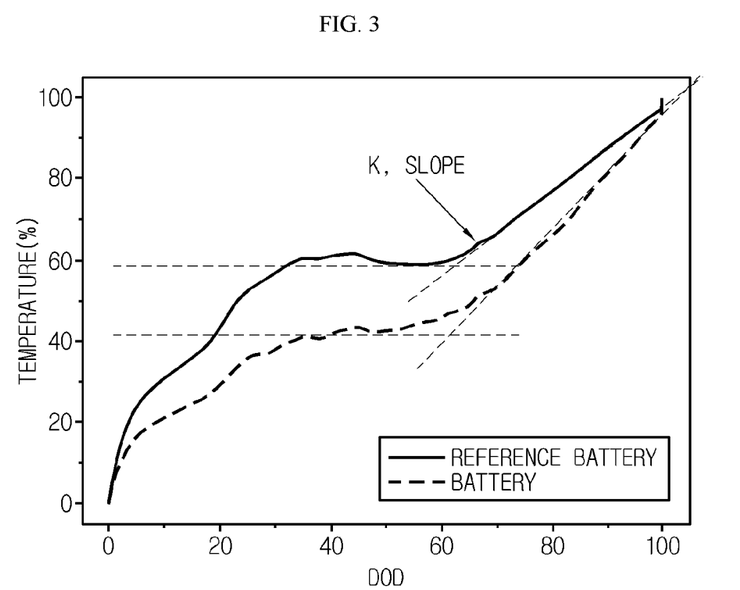
FIG. 3 shows a temperature profile according to DOD of a battery.

For example, a reference temperature profile as shown in FIG. 3 may be plotted. The reference temperature data stored in the memory unit 110 in advance may have a matrix structure of data pairs about the temperature according to DOD, or the reference temperature increase rate K1 of the discharge last half with DOD of 50% or above calculated therefrom. The reference temperature increase rate K1 may be calculated directly from the reference temperature data or may be obtained from a graph tangent slope of the DOD last half from the temperature profile as shown in FIG. 3 (corresponding to Step s2 in FIG. 2 as the second step of the SOH analyzing method). In particular, the graph tangent slope of the DOD last half may be obtained after finding an onset second inflection point in the reference temperature profile. The reference temperature increase rate K1 of the discharge last half with DOD of 50% or above is determined as a comparison standard, judging that the temperature increase rate of the DOD last half represents the internal state of the battery better compared to the temperature increase rate of the DOD first half.

Since the battery may be affected by the ambient temperature during the measurement, it is preferable to measure the surface temperature of the reference battery in various temperature environments through experiments and store as data in advance. For example, the surface temperature change of the reference battery at various temperatures such as −5° C., 10° C. and 25° C. are measured in advance.

Preferably, the control unit 120 may be electrically coupled to a voltage measuring unit 130, a current measuring unit 140 and a temperature measuring unit 150 to determine other variables such as SOC and resistance of the battery B.

The voltage measuring unit 130 includes a known voltage measurement circuit, and periodically measures the voltage of the battery B at a time interval under the control of the control unit 120, and outputs the measured voltage to the control unit 120. Then, the control unit 120 stores the periodically inputted measured voltage in the memory unit 110. If the voltage of the battery B is measured, the depth of discharge may be known therefrom.

The current measuring unit 140 includes a sense resistor or a hall sensor, and measures the magnitude of the charge or discharge current of the battery B at a time interval under the control of the control unit 120 and outputs the measured current to the control unit 120. Then, the control unit 120 stores the periodically inputted measured current in the memory unit 110.

The temperature measuring unit 150 includes a thermocouple that is a type of temperature sensor, and periodically measures the temperature of the battery B at a time interval under the control of the control unit 120 and outputs the measured temperature to the control unit 120. Then, the control unit 120 stores the periodically inputted measured temperature in the memory unit 110.

A measuring and recording unit 122 of the control unit 120 measures temperature data according to DOD while the battery B in a full charge state is being discharged and stores the measured temperature data in the memory unit 110 (corresponding to Step s3 of FIG. 2 as the third step of the SOH analyzing method). The temperature of the battery B measured by the temperature measuring unit 150 is stored in the memory unit 110 as the temperature data according to DOD by the measuring and recording unit 122.

At this time, it is preferable that the discharge is a constant current (CC) discharge and the temperature is obtained by measuring the surface temperature of the battery B, identical to the reference battery.

Identical to the reference battery, if DOD increases, the temperature of the battery B gradually rises, thereby obtaining a temperature profile that rises along with the increase of DOD. This is depicted in FIG. 3 as an example.

A calculating unit 124 of the control unit 120 calculates a temperature increase rate K2 of the discharge last half with DOD of 50% or above from the temperature data according to DOD obtained by the measuring and recording unit 122. At this time, the temperature increase rate K2 may also be calculated directly from the temperature data or may also be obtained from the graph tangent slope of the DOD last half from the temperature profile as shown in FIG. 3 (corresponding to Step s4 of FIG. 2 as the fourth step of the SOH analysis method). In particular, the graph tangent slope of the DOD last half may be obtained after finding the onset second inflection point in the temperature profile, as described above in relation to the reference temperature profile.

A determining unit 126 of the control unit 120 determines the degree of degradation of the battery B in comparison to the reference battery by comparing the reference temperature increase rate K1 and the temperature increase rate K2 (corresponding to Step s5 of FIG. 2 as the fifth step of the SOH analyzing method).

At this time, for example, the ambient temperature at measurement may be considered together so that, if the temperature of the battery B in the actual measurement environment is 25° C., the measurement result can be compared with the temperature data of the reference battery measured at 25° C. in advance.

Generally, as the use cycle of the battery progresses, intercalation and de-intercalation of lithium ions are repeated at a negative electrode and a positive electrode to cause phase transition and degrade the structural change. The inventor of the present disclosure has found through research that the degree of degradation caused by the structural change has a significant effect on the amount of entropic heat generated within the battery. It has been experimentally found that a battery with a lot of use cycles has different entropic heat compared with the initial battery, namely the reference battery. Thus, the present disclosure has been proposed based on the fact that the degree of degradation of the battery can be deduced by comparatively analyzing temperature changes. As described above, in the present disclosure, the voltage of the battery is measured during a constant current discharge (from which DOD can be found), and the temperature change of the battery surface is measured so that the degree of degradation of the battery is figured out by comparing the temperature increase rate.

Assuming that a slope of a straight line of the temperature profile depicted in FIG. 3 is K, the following equation is obtained.

$$K=\Delta \text{surface temperature}/\Delta DOD$$

Here, if an absolute value of K at the battery B subject to measurement is greater than an absolute value of K of the reference battery, namely if |K|>|K of the reference battery|, it may be estimated that the battery has been degraded compared to the reference battery. Since the temperature change due to entropic heat generation will increase as battery is degraded, the battery having a larger slope K may be regarded as having a greater degree of degradation.

Thus, as the temperature increase rate K2 is greater, the battery may be determined as having a greater degree of degradation.

At this time, it is desirable that information on other various sample batteries is collected in advance, such that the determining unit 126 may quantitatively obtain the degree of degradation of the battery B. If the correlation data between the degree of degradation and the temperature increase rate are accumulated by performing the third step (s3) to the fifth step (s5) of the SOH analyzing method for several sample batteries, it is possible to determine SOH (%) at any temperature increase rate by synthesizing all data. For example, SOC may be classified into various sections such that the battery has SOH of 100% if the measured temperature increase rate of the battery is equal to the reference temperature increase rate, the battery has SOH of 90% if the temperature increase rate increases within 10% of the reference temperature increase rate, the battery has SOH of 80% if the temperature increase rate increases within 20% of the reference temperature increase rate, and the like. This may vary depending on battery types and should be determined experimentally. If the SOH value corresponding to each temperature increase rate is determined in advance, for example stored in a lookup table, after the actual temperature increase rate K2 the battery B is be calculated the SOH value corresponding thereto may be found and quantitatively displayed instantly.

The SOH of the battery B analyzed as described above may be used as an important indicator for determining whether the battery B is reusable as described later, and may also be used for output estimation while the battery B is in use.

The control unit 120 may also determine the output of the battery B by utilizing the analyzed SOH of the battery B and store the determined output information in the memory unit 110.

According to another aspect, the control unit 120 may be combined with a communication interface (I/F) 160 to output at least one of the estimated output and SOH values to an external device (not shown) through the communication interface 160.

Preferably, the external device may be a controller of a device load that is supplied with electrical energy from the battery B, but the present disclosure is not limited thereto.

Meanwhile, if it is intended to measure the temperature while the battery B is being discharged at a constant current after the battery B is fully charged, the temperature may not be easily measured during the cycle of use when the battery B is charged and discharged. Thus, for example, if the battery B is a vehicle battery, the related system may be configured so that the battery B is fully charged and then discharged when the battery charge/discharge is terminated, for example when a vehicle starter key is turned off, in order to perform SOH analyzing method. Also, since the battery B is in a full discharge state after the SOH analysis step, the system may be configured so that the battery B is charged for use. If the battery B is in a special type of being always fully charged and then used while the battery B is being discharged at constant current till the full discharge point, the SOH analysis step may not be separately implemented while the battery is not in use, but the system may be configured such that the SOH analyzing method as above is used while the battery is in use.

Further, the control unit 120 may selectively include a processor, an Application-Specific Integrated Circuit (ASIC), a chipset, a logic circuit, a register, a communication modem and a data processing device known in the art to execute various control logics disclosed herein.

Additionally, when the control logic is implemented in software, the control unit 120 may be implemented as a set of program modules. In this instance, the program module may be stored in the memory unit 110, and executed by the processor. The memory unit 110 may be inside or outside of the processor, and may be connected to the processor with a variety of well-known means.

At least one of the control logics associated with the first step (s1) to the fifth step (s5) of the SOH analyzing method as described above may be combined, and the combined control logics may be written in computer-readable coding systems and stored in computer-readable recording media. The recording media is not limited to a particular type and includes any type that can be accessed by the processor included in the computer. For example, the recording media may include at least one selected from the group consisting of ROM, RAM, register, CD-ROM, magnetic tape, hard disk, floppy disk and an optical data recording device.

Additionally, the coding systems may be modulated to a carrier signal and included in a communication carrier at a specific point in time, and may be stored and executed in computers connected via a network in distributed manner. Additionally, functional programs, codes and segments for implementing the combined control logics may be easily inferred by programs in the technical field pertaining to the present disclosure.

The SOH analyzing according to the present disclosure may be included as part of a system called a BMS. Additionally, the BMS may be mounted in various types of electric devices that can operate by electrical energy supplied from the battery B.

According to an aspect, the electric device may be a mobile phone, a mobile computer device such as a laptop computer and a tablet computer, or a handheld multimedia device including a digital camera, a video camera and an audio/video player.

According to another aspect, the electric device may be an electrically powered device that can move by electricity such as an electric vehicle, a hybrid electric vehicle, an electric bike, an electric motorcycle, an electric locomotive, an electric ship and an electric aircraft, or a power tool including a motor such as an electric drill and an electric grinder. According to still another aspect, the electric device may be a large-capacity energy storage system installed in a power grid to store renewable energy or redundant power, or an uninterruptible power system to supply power to various types of information communication devices including a server computer or a mobile communication device in an emergent situation such as blackout.

Now, hereinafter, the battery reuse diagnosing apparatus and method according to the present disclosure will be described in more detail with reference to FIG. 4 further based on the above configuration.

Figure 4:
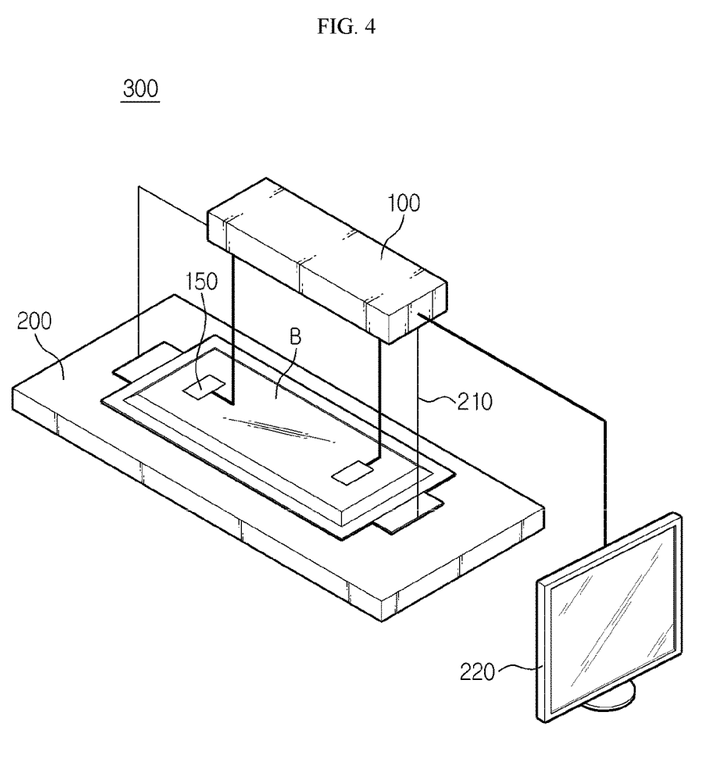
FIG. 4 is a diagram schematically showing a battery reuse diagnosing apparatus according to an embodiment of the present disclosure.

FIG. 4 is a diagram schematically showing a battery reuse diagnosing apparatus according to an embodiment of the present disclosure.

The battery reuse diagnosing apparatus 300 includes the SOH analyzing apparatus 100 of the present disclosure, a battery holder 200, a display device 220 and the like.

EV and HEV have been put to practical use by recent research and development. If batteries for such vehicles are used widely, a large number of used batteries will be generated as the vehicles are scrapped and the batteries are exchanged. The used batteries may include broken, defective or dead batteries but may also include batteries that are still available. In particular, a battery for a vehicle may be reused as a battery for ESS that may be used in milder conditions. Thus, it is economically and environmentally attractive to dispose of broken or seriously degraded batteries among the used batteries, and separately classify batteries that are still available to be reused in other purposes.

The battery reuse diagnosing apparatus 300 of the present disclosure may be used to properly classify the used batteries.

For example, a battery B subjected to reuse diagnosis is placed in the battery holder 200 and connected to the SOH analyzing apparatus 100 through a circuit 210. While the battery B is being discharged at a constant current, the voltage of the battery B is measured and sent to the memory unit of the SOH analyzing apparatus 100, and the surface temperature of the battery B is measured by the temperature measuring unit 150 and transmitted to the measuring and recording unit of the SOH analyzing apparatus 100, thereby obtaining temperature data of the battery B.

The SOH analyzing apparatus 100 determines the degree of degradation of the battery B by comparing the reference temperature increase rate and the temperature increase rate of the battery B as described above. The calculation result and the determination result of the SOH analyzing apparatus 100 performed at this time may be displayed through the display device 220. For example, the temperature profile described above with reference to FIG. 3 or the SOH value of the battery B read out from the stored SOH value for each temperature increase rate may be displayed so that the user may easily check the SOH value and the like. The user may see the result on the display device 220 and determine whether to discard or reuse the battery B.

The battery reuse diagnosing method according to the present disclosure may be accomplished by using the battery reuse diagnosing apparatus as described above, or by using the SOH analyzing method as described above.

A preferred battery reuse diagnosing method will be described further. First, the surface temperature of the reference battery according to DOD is measured while the reference battery in the full charge state is being discharged at a constant current, thereby obtaining the reference temperature profile according to DOD. This corresponds to Step s1 of FIG. 2.

Next, the slope S1 is calculated in the reference temperature profile. This corresponds to Step s2 of FIG. 2.

Subsequently, the surface temperature of the battery subjected to reuse diagnosis according to DOD is measured while the battery subjected to reuse diagnosis in the full charge state is being discharged at a constant current, thereby obtaining the temperature profile of the battery subjected to reuse diagnosis according to DOD. This corresponds to Step s3 of FIG. 2 and also corresponds to the use of the battery reuse diagnosing apparatus of FIG. 4.

Next, the slope S2' is calculated in the temperature profile of the battery subject to reuse diagnosis according to DOD. This corresponds to Step s4 of FIG. 2 and also corresponds to the use of the battery reuse diagnosing apparatus of FIG. 4.

Subsequently, the slope S1 and the slope S2' are compared to check the degree of degradation of the battery in comparison to the reference battery and to determine whether or not to reuse the battery. This corresponds to Step s5 of FIG. 2 and also corresponds to the use of the battery reuse diagnosing apparatus of FIG. 4.

In particular, as described above, through experiments, several sample batteries with different degrees of degradation may be prepared, and the surface temperature of each sample battery according to DOD may be obtained while each sample battery in a full charge state is being at a constant current, thereby acquiring the temperature profile of each sample battery according to DOD. Here, the slope S2 may be calculated from the temperature profile of each sample battery according to DOD, and then the correlation data between the degree of degradation and the slope S2 may be accumulated and recorded. In this case, the degree of degradation corresponding to the slope S2' of the battery subject to diagnosis may be found and used to diagnose the degree of degradation of the battery subjected to reuse diagnosis. For example, if it is decided to reuse only batteries with SOH greater than 70% and less than 80% SOH, when the battery subjected to reuse diagnosis is analyzed to have SOH of 75%, the battery will be classified as a reusable battery and then follow-up measures are conducted to the battery for the next use. However, if the battery subjected to reuse diagnosis is analyzed to have SOH of 60%, the battery is classified as a wasted battery and follow-up measures are conducted to the battery. The battery reuse diagnosis method according to the present disclosure is utilized in this way.

In describing various embodiments of the present disclosure, components designated by '~unit' should be understood as elements which are classified functionally rather than physically. Accordingly, each component may be selectively combined with other component, or may be divided into subcomponents for efficient execution of control logic(s). However, it is obvious to those skilled in the art that even though the components are combined or divided, if the sameness of functions can be acknowledged, the combined or divided components should be construed as being in the scope of the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

What is claimed is:

1. A state of health (SOH) analyzing apparatus, comprising:
   a memory unit configured to store reference temperature data according to a depth of discharge (DOD) of a reference battery, or a reference temperature increase rate (K1) of a discharge last half with the DOD of 50% or above, calculated therefrom; and
   a control unit,
   wherein the control unit includes:
   a measuring and recording unit configured to measure temperature data according to the DOD while a battery in a full charge state is being discharged and to store the measured temperature data in the memory unit;
   a calculating unit configured to calculate a temperature increase rate (K2) of the discharge last half with the DOD of 50% or above from the temperature data according to the DOD obtained by the measuring and recording unit; and
   a determining unit configured to determine a degree of degradation of the battery in comparison to the reference battery by comparing the reference temperature increase rate (K1) and the temperature increase rate (K2).

2. A state of health (SOH) analyzing method, comprising:
   (a) obtaining reference temperature data according to a depth of discharge (DOD) by measuring a temperature of a reference battery according to the DOD while the reference battery in a full charge state is being discharged;
   (b) calculating a reference temperature increase rate (K1) of a discharge last half with DOD of 50% or above from the reference temperature data according to the DOD;
   (c) obtaining temperature data according to the DOD by measuring a battery temperature according to the DOD while a battery in a full charge state is being discharged;
   (d) calculating a temperature increase rate (K2) of the discharge last half with DOD of 50% or above from the temperature data according to the DOD; and
   (e) determining a degree of degradation of the battery in comparison to the reference battery by comparing the reference temperature increase rate (K1) and the temperature increase rate (K2).

3. The SOH analyzing method according to claim 2, wherein the discharge in the steps (a) and (c) is a constant current (CC) discharge, and the temperature is a battery surface temperature.

4. The SOH analyzing method according to claim 2, wherein in the steps (b) and (d), the reference temperature increase rate (K1) and the temperature increase rate (K2) are is calculated by:
   preparing a temperature profile by plotting temperature data according to the DOD; and
   obtaining a graph tangent slope of a DOD last half after finding an onset second inflection point in the temperature profile.

5. The SOH analyzing method according to claim 2, wherein as the temperature increase rate (K2) is greater, the battery is determined as having a greater degree of degradation.

6. A battery management system, comprising the SOH analyzing apparatus according to claim 1.

7. A computer-readable non-transitory recording medium on which the SOH analyzing method according to claim 2 is programmed and recorded.

8. A battery reuse diagnosing apparatus, comprising:
   the SOH analyzing apparatus according to claim 1;
   a battery holder; and
   a display device configured to display a calculation result or a determination result of the SOH analyzing apparatus.

9. A battery reuse diagnosing method, comprising:
   (a) obtaining a reference temperature profile according to a depth of discharge (DOD) by measuring a surface temperature of a reference battery according to the DOD while the reference battery in a full charge state is being discharged at a constant current;
   (b) calculating a slope (S1) in the reference temperature profile;
   (c) obtaining a temperature profile of a battery subjected to a reuse diagnosis according to the DOD by measuring a surface temperature of the battery subjected to a reuse diagnosis according to the DOD while the battery subjected to a reuse diagnosis in a full charge state is being discharged at a constant current;
   (d) calculating a slope (S2') in the temperature profile of the battery subjected to a reuse diagnosis according to the DOD; and
   (e) determining whether or not to reuse the battery by determining a degree of degradation of the battery in comparison to the reference battery by comparing the slope (S1) and the slope (S2').

10. The battery reuse diagnosing method according to claim 9, further comprising between the step (b) and the step (c):
    (b-1) obtaining a sample temperature profile according to the DOD by acquiring a surface temperature of a sample battery according to the DOD while the sample battery in a full charge state is being discharged at a constant current;
    (b-2) calculating a slope (S2) in the sample temperature profile according to the DOD;
    (b-3) determining that the sample battery is degraded in comparison to the reference battery when the slope (S2) is greater than the slope (S1), and recording correlation data between the degree of degradation and the slope (S2); and
    (b-4) repeating the steps (b-1) to (b-3) to other sample batteries to accumulate correlation data between the degree of degradation and the slope (S2), wherein in the step (e), it is determined whether or not to reuse the battery by diagnosing the degree of degradation of the battery subjected to a reuse diagnosis by finding the degree of degradation corresponding to the slope (S2') from the correlation data between the degree of degradation and the slope (S2).

\* \* \* \* \*